US006453448B1

(12) United States Patent
Meyer

(10) Patent No.: US 6,453,448 B1
(45) Date of Patent: Sep. 17, 2002

(54) FUNCTIONAL LEVEL CONFIGURATION OF INPUT-OUTPUT TEST CIRCUITRY

(75) Inventor: James W. Meyer, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/327,278

(22) Filed: Jun. 3, 1999

(51) Int. Cl.[7] .............................................. G06F 17/50
(52) U.S. Cl. .................. 716/4; 716/5; 716/18
(58) Field of Search ....................... 716/1–21; 703/13, 703/14, 15, 16, 17; 714/25–26, 30, 724–745; 324/210–212, 765–769

(56) References Cited

U.S. PATENT DOCUMENTS

| | | | | |
|---|---|---|---|---|
| 5,519,627 A | * | 5/1996 | Mahmood et al. | 716/18 |
| 5,555,201 A | * | 9/1996 | Dangelo et al. | 716/1 |
| 5,572,712 A | * | 11/1996 | Jamal | 716/18 |
| 5,631,911 A | * | 5/1997 | Whetsel, Jr. | 714/727 |
| 5,774,476 A | * | 6/1998 | Pressly et al. | 714/726 |
| 5,841,663 A | * | 11/1998 | Sharma et al. | 364/490 |
| 5,867,339 A | * | 2/1999 | Rostoker et al. | 716/18 |
| 5,903,475 A | * | 5/1999 | Gupte et al. | 703/16 |
| 6,071,314 A | * | 6/2000 | Baxter et al. | 716/17 |
| 6,081,916 A | * | 6/2000 | Whetsel, Jr. | 714/727 |
| 6,115,763 A | * | 9/2000 | Douskey et al. | 710/72 |
| 6,195,774 B1 | * | 2/2001 | Jacobson | 710/727 |

OTHER PUBLICATIONS

Zarrinch et al, "A Design for Tes Perspective on I/O Management," IEEE, Oct. 1996, pp. 46–53.*
Frye et al, "Performance Evaluation of MCM Chip–to–Chip Interconnections Using Custom I/O Buffers Designs," IEEE, Oct. 1993, pp. 464–467.*
Calvez et al, "Functional–Level Synthesis with VHDL," IEEE, Sep. 1995, pp. 554–559.*
Chen, et al, "VHDL Behavioral ATPG and Fault Simulation of Digital Systems," IEEE, Apr. 1998, pp. 428–440.*

* cited by examiner

Primary Examiner—Vuthe Siek
(74) Attorney, Agent, or Firm—Trop, Pruner & Hu, P.C.

(57) ABSTRACT

A method and system for representing an electronic device having input-output ports and test circuits associated with the input-output ports includes: receiving a functional level description of the electronic device; determining a connectivity relationship between a first test circuit associated with a first input-output port and a second test circuit associated with a second input-output port; and generating a functional level representation of the determined connectivity relationship. Functional level descriptions include hardware description languages such as VHDL and VERILOG.

54 Claims, 4 Drawing Sheets

FUNCTIONAL LEVEL CONFIGURATION OF INPUT-OUTPUT TEST CIRCUITRY

BACKGROUND

The invention relates generally to semiconductor device design and, more particularly, to the functional representation of the device's input-output test circuitry.

The design of semiconductor devices using programmable logic device (PLD), application specific integrated circuit (ASIC), and field programmable gate array (FPGA) technologies generally includes the design of input-output (I/O) circuits for each of the device's I/O ports and the test circuitry to validate operation of the I/O circuits. In one test mode, I/O test circuits coupled into a string configuration wherein the output from one test circuit is coupled to the input of the next closest test circuit. Following device fabrication, I/O test circuit strings may be used to facilitate operational testing such as, for example, determining whether an I/O circuit meets DC input and output threshold voltage requirements.

Referring to FIG. 1, a typical design process for an ASIC device begins with a designer's conception (block 100), followed by the development of a functional model (block 102). Functional models may be generated using any one of a variety of hardware description languages such as VHDL and VERILOG. Functional models may be used to exercise and/or verify the operational characteristics of the device's design via simulation tools. Once a design is thought to be complete, it may be compiled (also referred to as synthesized) into a gate level description (block 104) that describes the device in terms of vendor-specific gates and interconnections thereto. Following compilation, the gate level description may be imported into a vendor-specific place and route tool (block 106) that may then be used to generate a netlist (block 108)—the electrical connectivity data associated with the specified design. Netlist data may then be used to drive fabrication and/or assembly equipment (block 110).

Input-output circuitry is typically identified (e.g., its position within the device) and automatically interconnected during netlist generation (block 108). At this stage in the design process, however, the information describing this interconnection is not available to functional circuit simulations which are performed on the model of block 102. Further, it is not currently possible to extract I/O test circuit connectivity descriptions from a netlist and "insert" it into a functional model, e.g., the model of block 102. Thus, designers are not readily able to simulate the complete device circuitry. Alternatively, it is possible to manually specify I/O test circuit interconnectivity at the functional description level (e.g., during the acts of block 102). This technique, however, may require large amounts of a designer's time and is prone to data entry error. Consider, for example, the task of manually specifying the interconnection of 300 I/O test circuits.

Thus, it would be beneficial to provide a mechanism to automatically specify the interconnection of I/O test circuitry at the functional model level during a semiconductor design process.

SUMMARY

In one embodiment the invention provides a method of representing an electronic device having input-output ports and test circuits associated with the input-output ports. The method includes receiving a functional level description of the electronic device, determining a connectivity relationship between a first test circuit associated with a first input-output port and a second test circuit associated with a second input-output port, and generating a functional level representation of the determined connectivity relationship. Functional level descriptions include hardware description languages such as VHDL and VERILOG. Methods in accordance with the invention may be stored in any media that is readable and executable by a computer system.

In another embodiment, the invention provides a computer aided design system, that includes a processor, a storage device coupled to the processor, and a program stored on the storage device to generate a functional level representation in accordance with the previously described method.

DETAILED DESCRIPTION

Techniques (including methods and devices) to automatically specify the configuration of semiconductor device input-output test circuitry are described. The following embodiments of the invention, described in terms of a VHDL functional model, are illustrative only and are not to be considered limiting in any respect.

Figure 2:
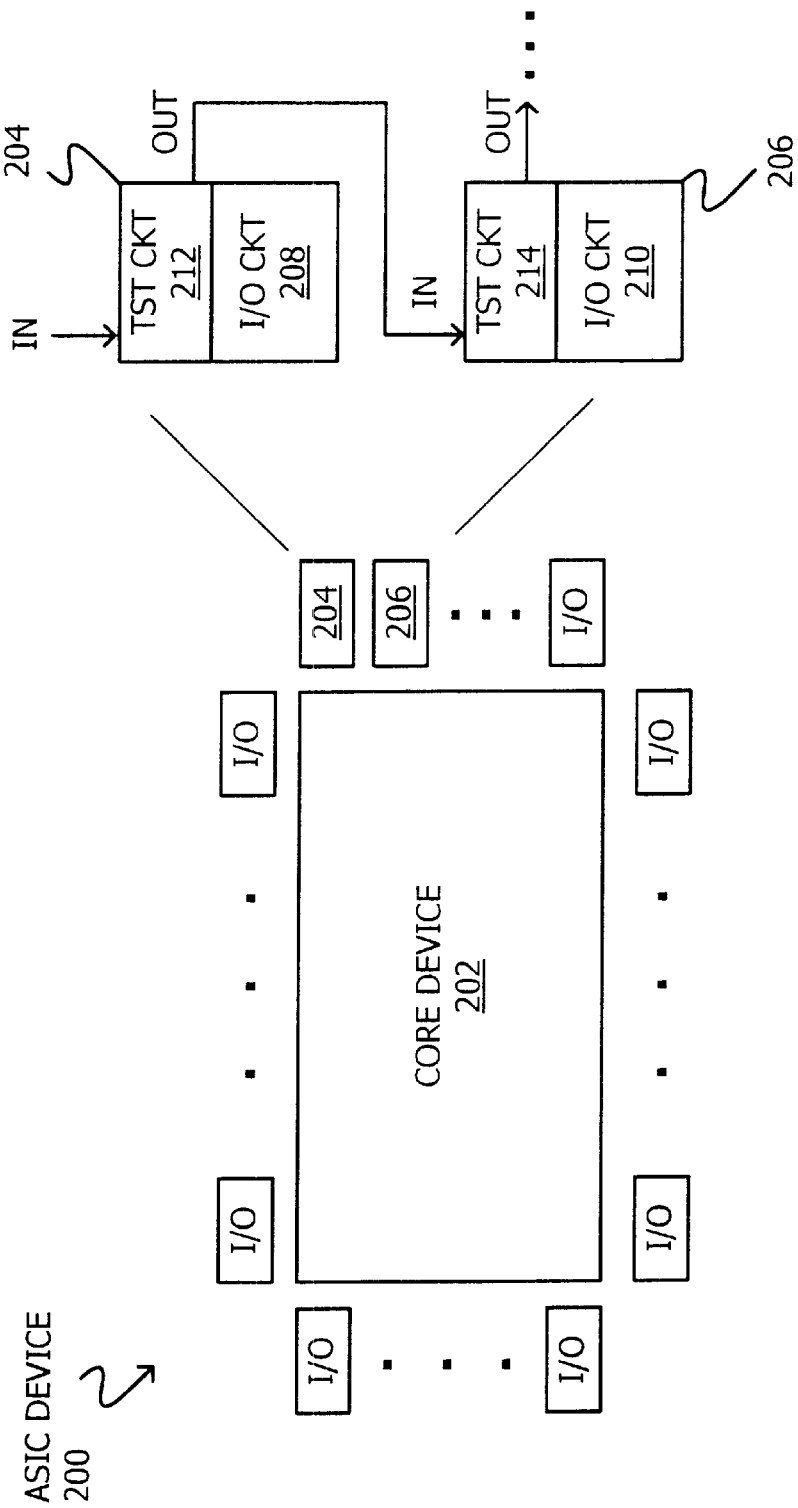
FIG. 2 shows a custom designed semiconductor device having input-output buffers that include both functional circuitry and test circuitry.

Referring to FIG. 2, custom designed semiconductor device 200 generally includes core device 202 that embodies the device's functional circuitry and a plurality of input-output (I/O) buffers (e.g., 204 and 206). Each I/O buffer includes I/O circuitry (e.g., 208 and 210) that embodies the desired I/O buffer's functional circuitry and I/O test circuitry (e.g., 212 and 214) that may be used to test the operational characteristics of the buffer's functional circuitry (e.g., 208 and 210). One aspect of the design process is to configure a device's I/O test circuits into strings, wherein the output from one test circuit (e.g., 212) is coupled to the input of the next closest test circuit (e.g., 214). In this configuration, operational characteristics of the I/O circuits themselves may be tested.

Figure 3:
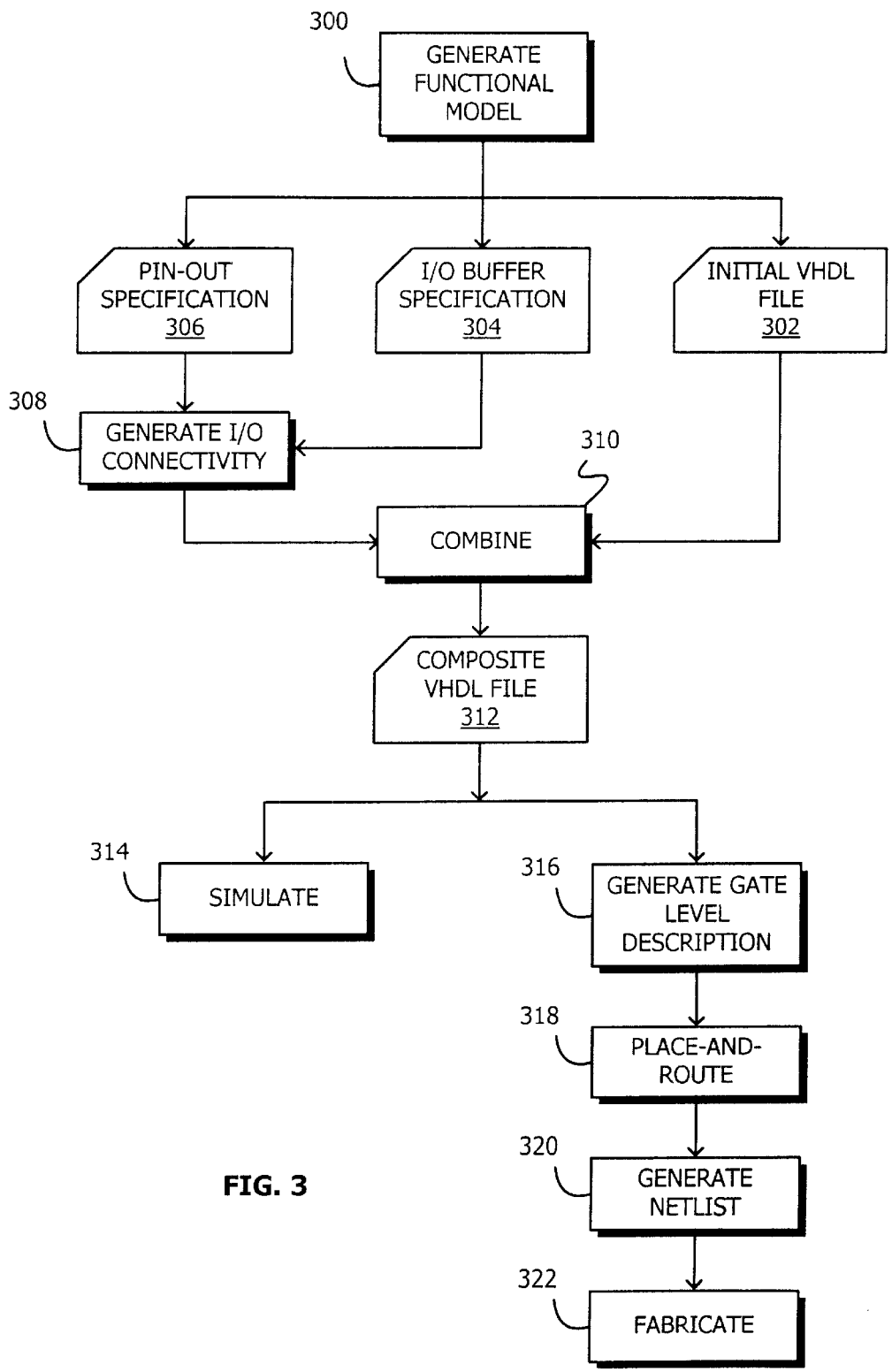
FIG. 3 shows the flowchart of a semiconductor design process in accordance with one embodiment of the invention.

Referring to FIG. 3, a semiconductor design process in accordance with one embodiment of the invention begins with the development of a functional model representing target device 200 (block 300). Functional models are typically expressed in a chosen hardware description language (HDL) such as VHDL and embodied in VHDL file 302 as a sequence of VHDL statements or instructions.

In addition to VHDL file 302, I/O buffer specification 304 and pin-out specification 306 are generated as a part of, or subsequent to, the initial functional description embodied in file 302. Input-output buffer specification 304 describes the functional structure and connectivity guidelines for each type of I/O buffer used in the design of device 200. In one embodiment, I/O buffer specification 304 includes a buffer type identifier or name, a list of the buffer's input ports, a list of the buffer's output ports, and a description of how the input and output ports are to be configured (i.e., connectivity rules) for each type of buffer specified by the designer during generation of VHDL file 302. For example, an I/O buffer may have input A, output Z, test circuit input PI, and test circuit output PO. In another example, an I/O buffer may have bidirectional inputs A and EN, outputs ZI and ZO, test circuit input PI, and test circuit output PO.

The structural description of each buffer (e.g., its identifier and list of input and output ports) is generally defined by the vendor chosen to provide simulation and/or gate level description capability. The rules describing how each buffer port is to be configured are specific to the device being designed (e.g., 200) and are established by the designer as part of the design process. For example, for a given device pin "P" the connection from an I/O buffer to the device's core logic may be made through netlist identifier "Pi," the connection from the core logic to the I/O buffer may be made through the netlist name "Po," and an enable signal from the core logic to the I/O buffer's enable input (in a bidirectional I/O buffer, for example) may be made through netlist name "Pe".

Pin-out specification 306 associates, for each I/O signal of target device 200, an I/O signal name (e.g., D0 for data bit zero and A10 for address bit ten), with an I/O buffer type (e.g., input, output, and bidirectional) and a pin identifier (e.g., pin 0 and pin 75) that identifies a specific I/O pin location on a chosen semiconductor device package. It will be recognized that each semiconductor device package has a predetermined number of I/O pins and, further, that each I/O pin's location may be uniquely determined by its name or identifier. Illustrative device packages include 452 and 580 pin gate array devices.

Figure 4:
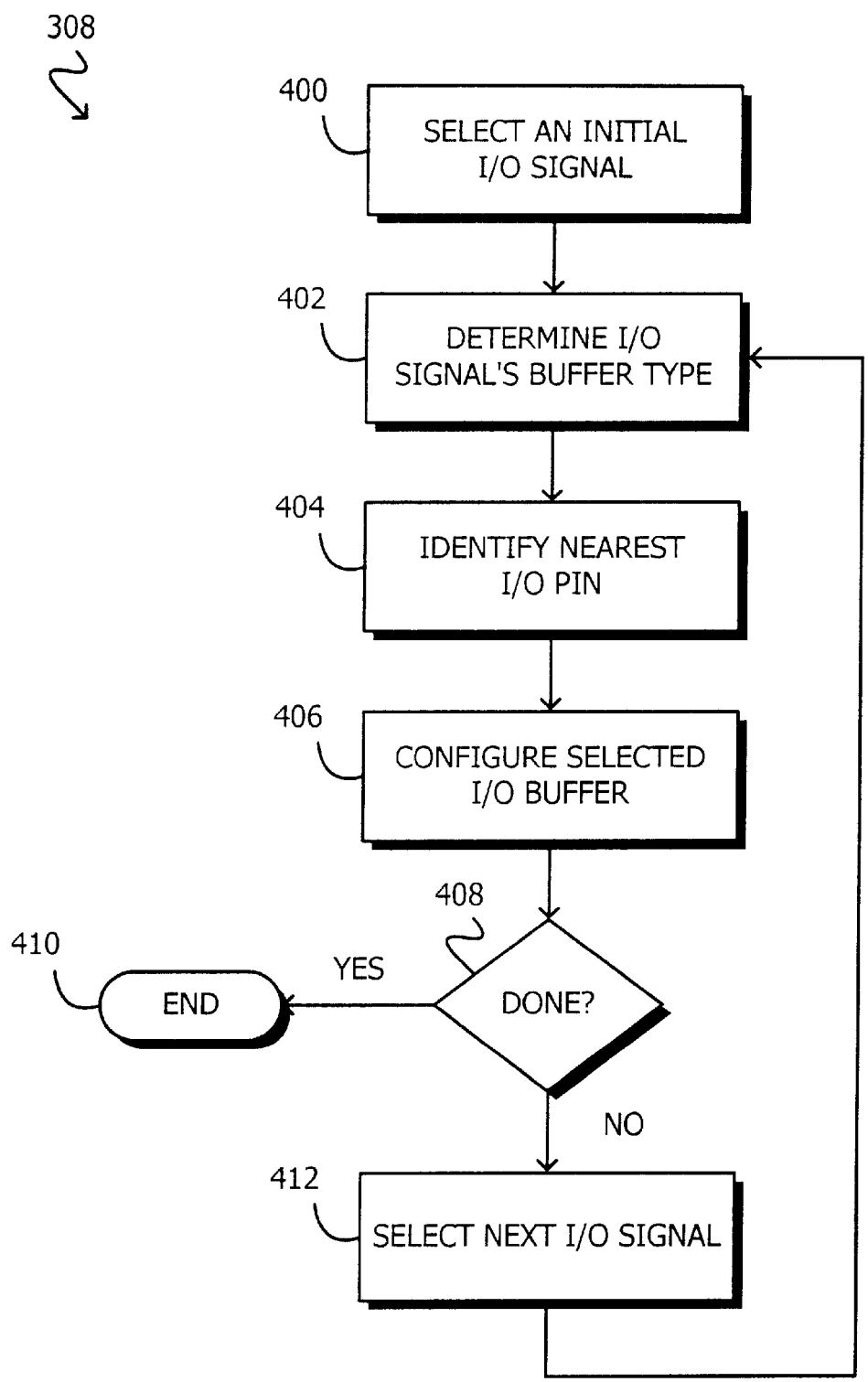
FIGS. 4 shows the flowchart of one aspect of the design process of FIG. 3 in accordance with the invention.

Based on I/O buffer 304 and pin-out 306 specifications, a functional level description of a device 200's I/O buffer configuration may be generated (block 308). FIG. 4 illustrates one technique in accordance with the invention to generate a functional level description of device 200's I/O buffer configuration. An initial I/O signal is selected from those I/O signals identified in pin-out specification 306 (block 400). For example, the first I/O signal listed in pin-out specification 306 may be selected. Alternatively, that I/O signal associated with a specified device package I/O pin (e.g., pin 1) may be selected. Next, the buffer type associated with the selected I/O signal is determined (block 402), and that I/O device package pin that is nearest, or at some other predetermined relationship to the selected I/O pin is identified (block 404). The ability to determine a "nearest neighbor" or some other predetermined relationship of a specified I/O pin relies on knowledge of the device package chosen by the designer. Based on the selected I/O pin, the identified nearest I/O pin, and the buffer type (including the identified buffer's connectivity rules), a functional level (e.g., VHDL) description of the selected I/O buffer's configuration is generated (block 406). In one embodiment, the generated function level VHDL description of a buffer's configuration has the following form:

ID: <Buffer Type> port map (Port1_Name ⇒ First_Signal_Name, Port2_Name ⇒ Second_Signal_Name, . . . , PortN_Name ⇒ Last_Signal_Name);

where ID represents a unique identifier/name value for the I/O buffer, <Buffer Type> identifies the type of buffer, port map indicates the beginning of a connectivity specification, and the notation Port_Name ⇒Signal_Name indicates that the I/O buffer's port identified by Port_Name is to be coupled to the device signal identified by Signal_Name.

Following generation of a functional specification for a first I/O buffer, a check is made to determine if all I/O signals identified in pin-out specification 306 have been processed. If all I/O signals have been processed (the 'yes' prong of diamond 408), processing halts (block 410). If all I/O signals have not been processed (the 'no' prong of diamond 408), another I/O signal is selected (block 412) and processing continues at block 402.

Referring again to FIG. 3, the I/O buffer configuration generated during the acts of block 308 may be combined (block 310) with initial VHDL file 302 to generate composite VHDL file 312. Composite VHDL file includes a functional description of core device 202, I/O buffers (e.g., 204 and 206), and the connectivity between I/O test circuits (e.g., 212 and 214). The act of combining initial VHDL file 302 and I/O buffer connectivity specifications as illustrated above may be facilitated by representing each in a text format (e.g., ASCII text). Using this representation, I/O buffer specifications may be "cut and pasted" into the architectural module of initial VHDL file 302.

Composite VHDL file 312 may be supplied as input to a functional simulator (e.g., ModelSim from Model Technology of Oregon) for test and design verification operations (block 314). Composite VHDL file 312 may also be used to generate a gate level description of the combined design (block 316) and, subsequently, imported into a place and route application (block 318). The place and route operation may then generate a netlist (block 320) which may, finally, be used during device fabrication.

One benefit of some embodiments of the invention is that functional models incorporating I/O buffer configuration data may be automatically generated by a design engineer during their functional specification efforts. This, in turn, allows a more complete simulation of the designed device. In particular, having a functional specification of a device's I/O buffers allows a more complete timing analysis of the target device. This is in contrast to prior art techniques in which I/O buffer configuration was added only after generation of a gate level model (e.g., following the acts of block 316), necessitating a significant reworking of the functional model to incorporate the (more detailed) I/O buffer configuration data. Another benefit of the invention is that test circuit simulation and verification may be performed using a functional model. This, in turn, allows connectivity errors to be detected earlier in a device's design life cycle (before creating a gate level model and before place and route operations are performed).

Various changes in the materials, components, as well as in the details of the illustrated operational methods are possible without departing from the scope of the claims. For instance, hardware description languages other than VHDL may be used. In addition, I/O buffer and pin-out specification data do not need to be maintained in separate files. For example, I/O buffer specification information may be obtained directly from an initial HDL file (e.g., VHDL file 302). Similarly, pin-out specification data may be obtained directly from an initial HDL file. Thus, segregating pin-out and I/O buffer specification information into discrete files as shown in FIG. 3 was done for ease of explanation and is not a restrictive feature of the invention.

Figure 1:
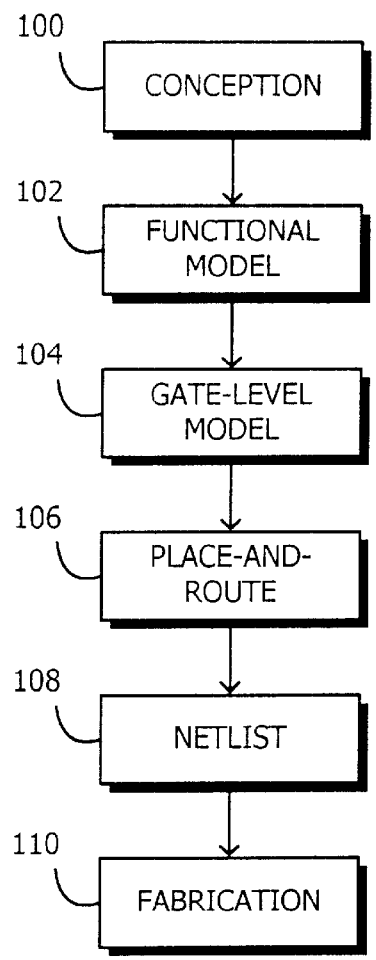
FIG. 1 shows a prior art semiconductor design process flowchart.
Figure 5:
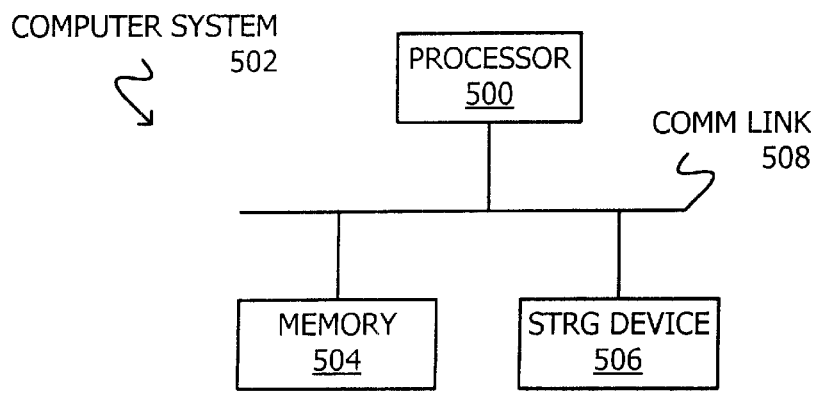
FIG. 5 shows a computer system in accordance with one embodiment of the invention.

Referring to FIG. 5, acts in accordance with FIGS. 3 and 4 may be performed by programmable control device 500 executing instructions organized into one or more program modules. As indicated, programmable control device 500 may be one element of computer system 502 which may also include system memory 504 and long-term storage device 506 coupled via communication link 508. Programmable control device 500 may be a single computer processor, a plurality of computer processors coupled by a communications link, or a custom designed state machine. System 502 may be a general purpose computer system (e.g., a personal computer) or a special purpose workstation (e.g., a computer aided design (CAD) workstation). Program modules may be stored in any storage device that may be operatively coupled to computer system 502. Storage devices (e.g., storage device 506) suitable for tangibly embodying program instructions include all forms of non-volatile memory including, but not limited to: semiconductor memory devices such as EPROM, EEPROM, and flash devices; magnetic disks (fixed, floppy, and removable); other magnetic media such as tape; and optical media such as CD-ROM disks.

While the invention has been disclosed with respect to a limited number of embodiments, numerous modifications and variations will be appreciated by those skilled in the art. It is intended, therefore, that the following claims cover all such modifications and variations that may fall within the true sprit and scope of the invention.

What is claimed is:

1. A computer executed method of representing an electronic device having input-output ports and test circuits associated with the input-output ports, the method comprising:
   receiving a functional level description of the electronic device;
   determining a connectivity relationship between a first test circuit associated with a first input-output port and a second test circuit associated with a second input-output port; and
   generating a functional level representation of the determined connectivity relationship.

2. The method of claim 1, wherein the act of receiving comprises receiving a hardware description language representation of the electronic device.

3. The method of claim 2 wherein the hardware description language representation is selected from the group consisting of VHDL and VERILOG languages.

4. The method of claim 1, wherein the act of determining comprises associating the output of the first test circuit with the input of the second test circuit.

5. The method of claim 4, wherein the second input-output port is selected based on the second input-output port being proximal to the first input-output port.

6. The method of claim 5, wherein the first input-output port and the second input-output port described as being nearest neighbors.

7. The method of claim 1, wherein the act of generating comprises generating a hardware description level representation of the determined connectivity relationship.

8. The method of claim 7, wherein the act of generating a hardware description level representation comprises generating a VHDL language representation of the determined connectivity relationship.

9. The method of claim 7, wherein the act of generating a hardware description level representation comprises generating a VERILOG language representation of the determined connectivity relationship.

10. The method of claim 1, further comprising generating a functional level simulation model of the electronic device and the determined connectivity relationship.

11. The method of claim 1, further comprising generating a gate level model of the electronic device and the determined connectivity relationship.

12. The method of claim 11, further comprising generating a netlist based on the generated a gate level model.

13. The method of claim 1, further comprising determining the connectivity relationship of at least one other test circuit associated with at least one other input-output port.

14. The method of claim 1, wherein the electronic device has a package with input-output pins, the first and second input-output ports comprising first and second input-output pins, respectively, and
   wherein determining the connectivity relationship comprises determining the connectivity relationship between the first test circuit associated with the first input-output pin and the second test circuit associated with the second input-output pin.

15. A program storage device, readable by a programmable control device, comprising:
   instructions stored on the program storage device for causing the programmable control device to
      receive a functional level description of the electronic device;
      determine a connectivity relationship between a first test circuit associated with a first input-output port and a second test circuit associated with a second input-output port; and
      generate a functional level representation of the determined connectivity relationship.

16. The program storage device of claim 15, wherein the instructions to receive comprise instructions to receive a hardware description language representation of the electronic device.

17. The program storage device of claim 16 wherein the hardware description language representation is selected from the group consisting of VHDL and VERILOG languages.

18. The program storage device of claim 15, wherein the instructions to determine comprise instructions to associate the output of the first test circuit with the input of the second test circuit.

19. The program storage device of claim 18, wherein the instructions to determine further comprise instructions to select the second input-output port based on the second input-output port being proximal to the first input-output port.

20. The program storage device of claim 15, wherein the instructions to generate comprise instructions to generate a hardware description language representation of the determined connectivity relationship.

21. The program storage device of claim 20, wherein the instructions to generate a hardware description language representation comprise instructions to generate a VHDL language representation of the determined connectivity relationship.

22. The program storage device of claim 20, wherein the instructions to generate a hardware description language representation comprise instructions to generate a VERILOG language representation of the determined connectivity relationship.

23. The program storage device of claim 15, further comprising instructions to generate a functional level simulation model of the electronic device and the determined connectivity relationship.

24. The program storage device of claim 15, further comprising instructions to generate a gate level model of the electronic device and the determined connectivity relationship.

25. The program storage device of claim 24, further comprising instructions to generate a netlist based on the generated a gate level model.

26. The program storage device of claim 15, wherein the electronic device has a package with input-output pins, the first and second input-output ports comprising first and second input-output pins, respectively, and wherein determining the connectivity relationship comprises determining the connectivity relationship between the first test circuit associated with the first input-output pin and the second test circuit associated with the second input-output pin.

27. A computer aided design system, comprising:

a processor;

a storage device operatively coupled to the processor; and a program stored on the storage device to receive a functional level description of an electronic device, determine a connectivity relationship between a first test circuit associated with a first input-output port and a second test circuit associated with a second input-output port, and generate a functional level representation of the determined connectivity relationship.

28. The computer aided design system of claim 27, wherein the program is adapted to receive, determine, and generate hardware description language representations of the electronic device.

29. The computer aided design system of claim 28, wherein the hardware description language representation is selected from the group consisting of VHDL and VERILOG languages.

30. The computer aided design system of claim 27, wherein the electronic device comprises a programmable logic device.

31. The computer aided design system of claim 27, wherein the program is further adapted to generate a functional level simulation model of the electronic device and the determined connectivity relationship.

32. The computer aided design system of claim 27, wherein the program is further adapted to generate a gate level model of the electronic device and the determined connectivity relationship.

33. The computer aided design system of claim 32, wherein the program is further adapted to generate a netlist based on the generated a gate level model.

34. The computer aided design system of claim 27, the program to further determine the connectivity relationship of at least one other test circuit associated with at least one other input-output port.

35. The computer aided design system of claim 27, wherein the electronic device has a package with input-output pins, the first and second input-output ports comprising first and second input-output pins, respectively, and the program to determine the connectivity relationship by determining the connectivity relationship between the first test circuit associated with the first input-output pin and the second test circuit associated with the second input-output pin.

36. A method, executed by a computer processor, to generate a test circuit configuration specification for a semiconductor device, the semiconductor device associated with a predetermined device package, the predetermined device package having a predetermined number and arrangement of input-output pins, the method comprising:

obtaining a first input-output signal identifier of the semiconductor device, the first input-output signal identifier being associated with a first input-output pin of the device package;

associating a first test circuit with the first input-output signal identifier, the first test circuit having an input identifier and an output identifier;

obtaining a second input-output signal identifier of the semiconductor device, the second input-output signal identifier being associated with a second input-output pin of the device package;

associating a second test circuit with the second input-output signal identifier, the second test circuit having an input identifier and an output identifier; and generating a hardware description language description that specifies coupling the output identifier of the first test circuit to the input identifier of the second test circuit.

37. The method of claim 36, further comprising generating a first computer readable file encoding the generated hardware description language description.

38. The method of claim 37, further comprising:

obtaining a computer readable file encoding a hardware description language description of the semiconductor device; and generating a second computer readable file by including the first computer readable file into the computer readable file encoding the hardware description language description of the semiconductor device.

39. The method of claim 38, further comprising generating a functional level simulation based on the second computer readable file.

40. The method of claim 38, further comprising generating a gate level model of the second computer readable file.

41. The method of claim 40, further comprising generating a netlist based on the gate level model.

42. The method of claim 36 wherein the hardware description language is selected from the group consisting of VHDL and VERILOG languages.

43. The method of claim 36, wherein the act of obtaining a first input-output signal identifier comprises parsing a pin-out specification, the pin-out specification further identifying a device package pin for the signal identifier.

44. The method of claim 36 wherein the act of associating a first test circuit with the first input-output signal identifier further comprises associating a first input-output buffer with the first input-output signal identifier, and the act of associating a second test circuit with the second input-output signal identifier further comprises associating a second input-output buffer with the second input-output signal identifier.

45. The method of claim 44, wherein the act of generating further comprises generating a hardware description language description that specifies coupling the first input-output buffer to the first input-output pin and the second input-output buffer to the second input-output pin.

46. The method of claim 36, wherein the act of obtaining a second input-output signal identifier comprises selecting an input-output signal identifier associated with a second input-output pin, the second input-output pin being proximally located to the first input-output pin.

47. The method of claim 46, wherein the act of selecting an input-output signal identifier associated with a second input-output pin comprises selecting that input-output signal identifier whose associated input-output pin is closest to the first input-output pin.

48. The method of claim 36, wherein the acts of obtaining the first input-output signal identifier, associating the first test circuit with the first input-output signal identifier, obtaining the second input-output signal identifier, associating the second test circuit with the second input-output signal identifier, and generating a hardware description language description are performed for each input-output signal identifier of the semiconductor device.

49. A method of representing an electronic device having input-output ports and test circuits associated with the input-output ports, the method comprising:

generating a functional model representing the electronic device;

generating input-output configuration information representing connectivity of test circuits and associated input-output ports; and combining the functional model with the input-output configuration information into a composite functional model.

50. The method of claim 49, further comprising supplying the composite functional model to a simulator to test the composite functional model, the composite functional model including a functional description of a core of the electronic device, input-output buffers of the electronic device, and the connectivity of the test circuits.

51. The method of claim 49, comprising:

providing the composite functional model in one of a VHDL language and a VERILOG language.

52. The method of claim 49, further comprising:

using the composite functional model to generate a gate-level description.

53. The method of claim 52, further comprising:

generating a netlist from the gate-level description.

54. The method of claim 49, wherein the electronic device has a package with input-output pins, the input-output ports comprising respective input-output pins, the method further comprising determining the connectivity between test circuits associated with the respective input-output pins.

\* \* \* \* \*